(12) United States Patent
Paz-Cruz

(10) Patent No.: US 10,431,009 B2
(45) Date of Patent: Oct. 1, 2019

(54) METHODS AND SYSTEMS FOR THREE DIMENSIONAL MODELING OF INFRASTRUCTURE ELEMENTS

(71) Applicant: The Board Of Regents Of The Nevada System Of Higher Education On Behalf Of The University of Nevada, Las Vegas, Las Vegas, NV (US)

(72) Inventor: Alexander Paz-Cruz, Henderson, NV (US)

(73) Assignee: The Board of Regents of the Nevada System of Higher Education on Behalf of the University of Nevada, Las Vegas, Las Vegas, NV (US)

(*) Notice: Subject to any disclaimer, the term of this patent is extended or adjusted under 35 U.S.C. 154(b) by 0 days.

(21) Appl. No.: 15/768,763

(22) PCT Filed: Oct. 14, 2016

(86) PCT No.: PCT/US2016/057114
§ 371 (c)(1),
(2) Date: Apr. 16, 2018

(87) PCT Pub. No.: WO2017/066621
PCT Pub. Date: Apr. 20, 2017

(65) Prior Publication Data
US 2018/0315255 A1 Nov. 1, 2018

Related U.S. Application Data

(60) Provisional application No. 62/242,078, filed on Oct. 15, 2015.

(51) Int. Cl.
*G06T 19/20* (2011.01)
*G06F 16/29* (2019.01)
(Continued)

(52) U.S. Cl.
CPC .............. *G06T 19/20* (2013.01); *G06F 16/29* (2019.01); *G06F 17/5004* (2013.01);
(Continued)

(58) Field of Classification Search
CPC . G06Q 50/16; G06T 2207/30184; G06T 5/50; G06T 1/0007; G06T 2207/10004;
(Continued)

(56) References Cited

U.S. PATENT DOCUMENTS

| | | | |
|---|---|---|---|
| 6,009,437 A | 12/1999 | Jacobs | |
| 6,229,546 B1 | 5/2001 | Lancaster et al. | |

(Continued)

OTHER PUBLICATIONS

International Search Report and Written Opinion dated Dec. 28, 2016 by the International Searching Authority for Patent Application No. PCT/US2016/057114, which was filed on Oct. 14, 2016 and published as WO 2017/066621 on Apr. 20, 2017 (Inventor—Alexander Paz-Cruz; Applicant—The Board of Regents of the Nevada System of Higher Education of Behalf of the University of Nevada, Las Vegas; (9 pages).

(Continued)

*Primary Examiner* — Haixia Du
(74) *Attorney, Agent, or Firm* — Ballard Spahr LLP

(57) ABSTRACT

Methods and systems for modeling infrastructure elements in three dimensions are disclosed. An example method can comprise a computer receiving information from a database. The received information can comprise structural information describing a form of a structure and condition information describing a condition of the structure. The computer can create a graphical model of the structure based on the structural information. The computer can further determine, based on the condition information, a condition of one or more portions of the structure, and can color the one or more portions of the structure based on the determined condition.

20 Claims, 11 Drawing Sheets

(51) Int. Cl.
*G06F 17/50* (2006.01)
*G06K 9/00* (2006.01)
*G06K 9/46* (2006.01)

(52) U.S. Cl.
CPC ..... *G06F 17/5009* (2013.01); *G06K 9/00201* (2013.01); *G06K 9/468* (2013.01); *G06T 2219/2012* (2013.01)

(58) Field of Classification Search
CPC ... G06T 7/0004; G06T 19/20; G06T 17/5004; G06T 2219/2012; G06K 2209/21; G06K 9/00637; G06K 9/00208; G06K 9/00671; G01V 1/008; G06F 17/30241
See application file for complete search history.

(56) References Cited

U.S. PATENT DOCUMENTS

| | | | |
|---|---|---|---|
| 6,888,544 B2 | 5/2005 | Malzbender et al. | |
| 7,164,883 B2 | 1/2007 | Rappaport et al. | |
| 7,609,269 B2 | 10/2009 | Wade et al. | |
| 8,374,390 B2 | 2/2013 | Stroila et al. | |
| 8,471,732 B2 | 6/2013 | Ren et al. | |
| 9,014,415 B2 | 4/2015 | Chen et al. | |
| 9,036,861 B2 | 5/2015 | Chen et al. | |
| 9,129,355 B1* | 9/2015 | Harvey | G06T 7/0008 |
| 9,146,126 B2 | 9/2015 | Stroila et al. | |
| 2004/0075697 A1* | 4/2004 | Maudlin | G06F 3/04815 |
| | | | 715/848 |

OTHER PUBLICATIONS

International Preliminary Report on Patentability dated Apr. 17, 2018 by the International Searching Authority for Patent Application No. PCT/US2016/057114, which was filed on Oct. 14, 2016 and published as WO 2017/066621 on Apr. 20, 2017 (Inventor—Alexander Paz-Cruz; Applicant—The Board of Regents of the Nevada System of Higher Education of Behalf of the University of Nevada, Las Vegas; (7 pages).

* cited by examiner

METHODS AND SYSTEMS FOR THREE DIMENSIONAL MODELING OF INFRASTRUCTURE ELEMENTS

CROSS REFERENCE TO RELATED PATENT APPLICATION

The present application is a national phase filing under 35 U.S.C. § 371 of International Application No. PCT/US2016/057114, filed on Oct. 14, 2016, which claims priority to U.S. provisional application USSN 62/242,078, filed on Oct. 15, 2015, the content of which is incorporated herein by reference in its entirety.

BACKGROUND

Infrastructure elements, such as bridges, are important assets and should be maintained in good condition to help ensure service and safety. Civil engineers are responsible for ensuring that bridges and other critical infrastructure elements are in working order, and developing plans to service damaged infrastructure.

State and federal Departments of Transportation (DOTs) require collection of annual data regarding critical infrastructure elements, such as bridges. The collected information includes both a physical description of the structure and an assessment of the structure's condition. While these data reflect the configuration and condition of the infrastructure elements, the data can be difficult to comprehend, even for trained engineers. In particular, the format of the data makes it difficult to decipher both structure configuration and condition of the bridge. Accordingly, there is a need for improved visualization tools for use with infrastructure elements. These and other difficulties are addressed in the following description.

SUMMARY

It is to be understood that both the following general description and the following detailed description are exemplary and explanatory only and are not restrictive. Provided are methods and systems for modeling infrastructure elements in three dimensions.

In an aspect, a computer can receive information from a database. The received information can comprise structural information describing a type of a structure and condition information describing a condition of the structure. The computer can create a graphical model of the structure based on the structural information. The computer can further determine, based on the condition information, a condition of one or more portions of the structure, and can color the one or more portions of the structure based on the determined condition.

In another aspect, a map interface can be provided to a user device. The user device can receive input indicating a geographic region of interest, and can determine a structure present in the geographic region of interest. The user device can retrieve, for the structure in the geographic region of interest, information from a database. The user device can create a graphical model of the structure based on the structural information.

Additional advantages will be set forth in part in the description which follows or may be learned by practice. The advantages will be realized and attained by means of the elements and combinations particularly pointed out in the appended claims.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION

Figure 1:
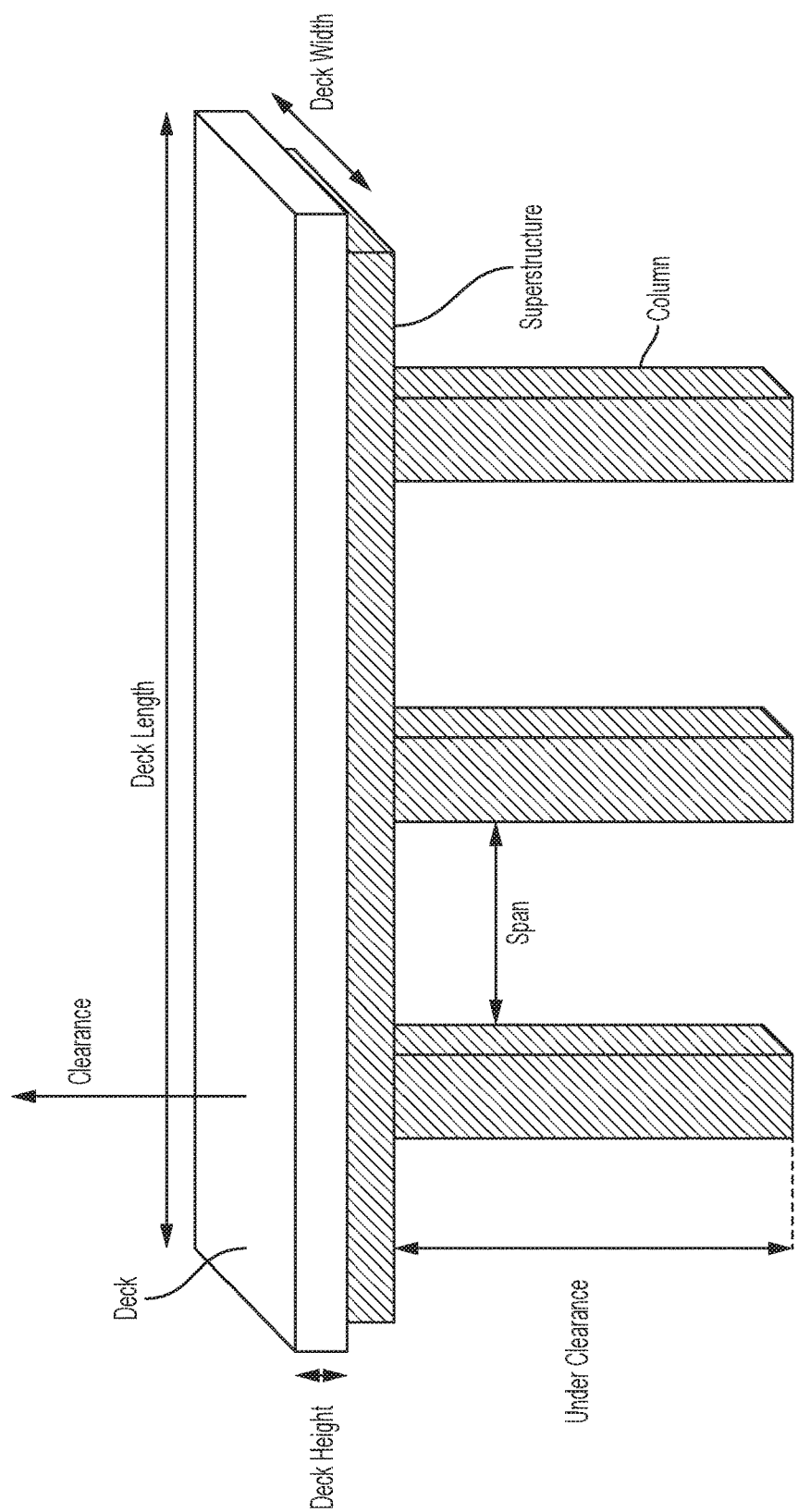
FIG. 1 is an illustration of a three dimensional model and the attributes used to produce the three dimensional model using methods described herein.

Before the present methods and systems are disclosed and described, it is to be understood that the methods and systems are not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

The present methods and systems may be understood more readily by reference to the following detailed description of preferred embodiments and the examples included therein and to the Figures and their previous and following description.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. Any suitable computer-readable storage medium may be utilized including hard disks, CD-ROMs, optical storage devices, solid state drives, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

State DOTs report annual data regarding critical infrastructure elements, such as bridges and culverts, to the Federal Highway Administration. The data is generally required to be formatted in a specific manner. For example, the data can be formatted according to the Recording and Coding Guide for Structure Inventory and Appraisal of the Nation's Bridges to create a National Bridge Inventory (NBI). State DOTs can use database systems to store and retrieve the data. In some aspects, the data can comprise structural (e.g., geometric) information describing the structure. In some aspects, the data can further comprise condition information indicating qualitative and/or quantitative measurements of a condition of the structure.

Figure 5:
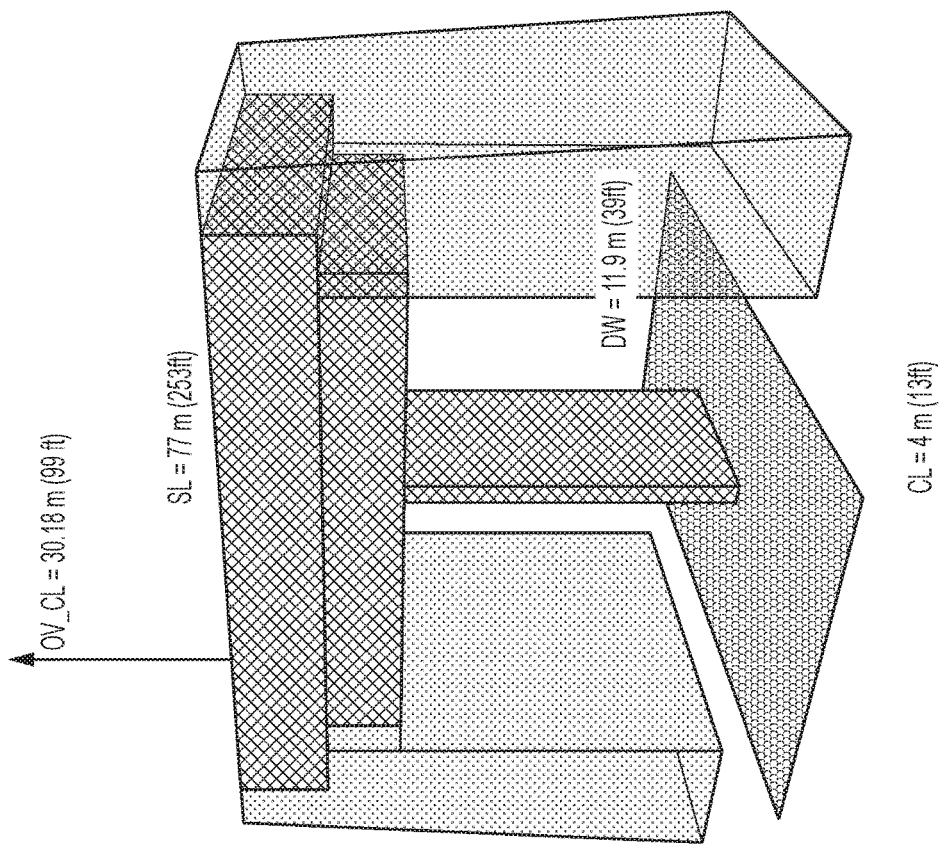
FIG. 5 is an illustration showing condition-based coloring of structural components for a three dimensional model produced using the methods described herein.
Figure 6A:
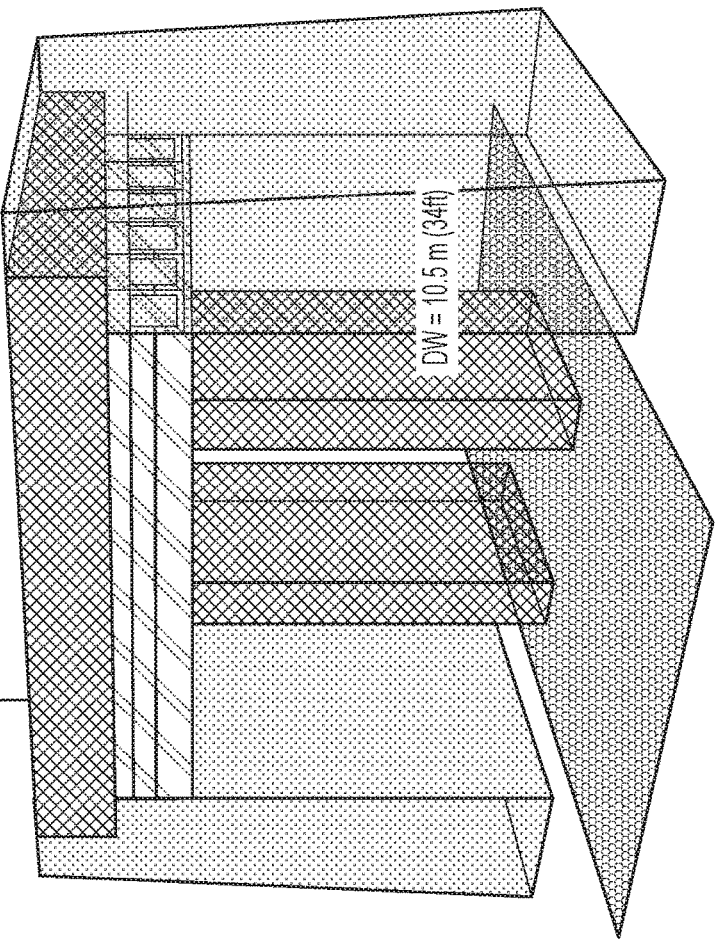
FIG. 6A is an illustration showing enhanced details of a particular bridge type according to methods disclosed herein.
Figure 6B:
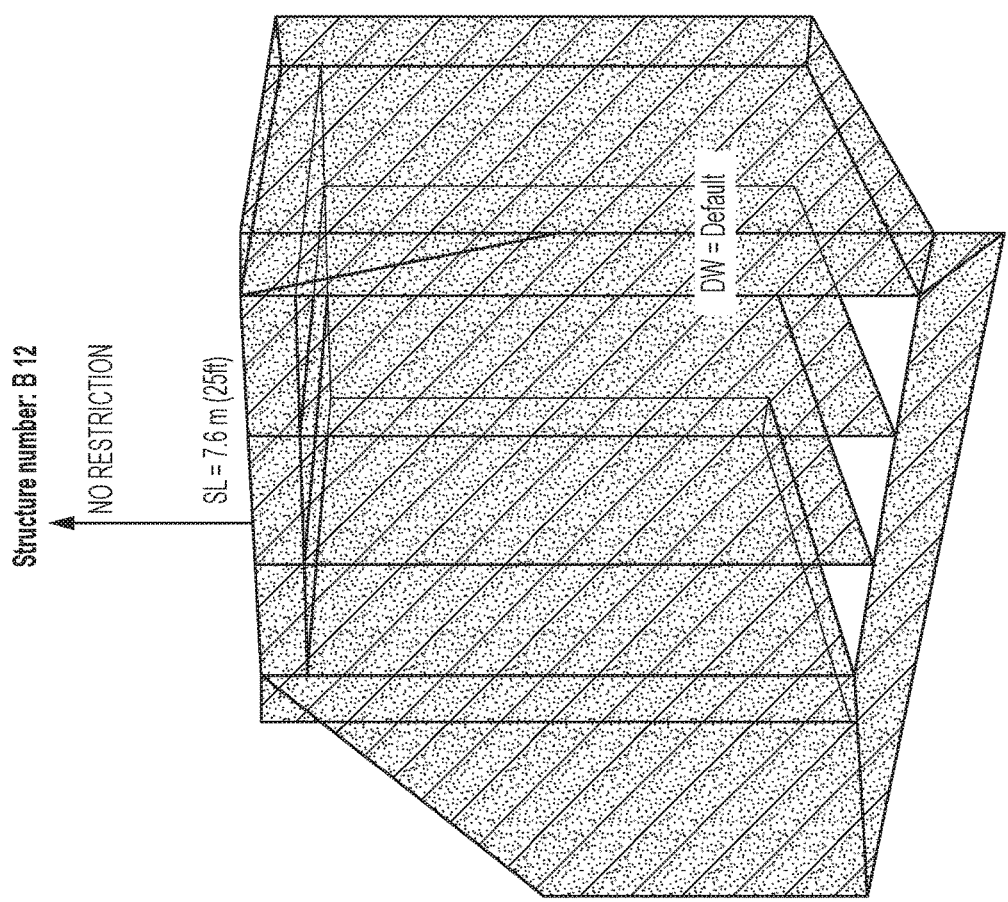
FIG. 6B is an illustration showing enhanced details of a culvert structure according to methods disclosed herein.

In some aspects of the disclosed methods and systems, the data can be accessed (e.g., stored and/or retrieved) using a database system. The database system can comprise an environment for statistical computing and data visualization, supporting data manipulation and transformations, and/or graphical displays. The database system can be used to generate a three dimensional (3D) model of the bridge based on the data (e.g., the structural information and the condition information). The 3D model generated by the disclosed methods and systems can illustrate the structure and principal characteristics of the structure in image form. As examples, FIGS. 5, 6A, and 6B show 3D models of a bridges and culverts. The disclosed methods and systems can use a set of instructions (e.g., a database queries) to execute a script to create and populate the 3D model. In some aspects, the script can be written in a statistical computing programming language, such as R.

The data (e.g., the structural information and the condition information) can be retrieved from the database system. The retrieved data can be stored in vectors for use in generating the 3D model. For example, in the case of a bridge or culvert, the information retrieved and vectors stored can comprise

| Vector Name | Attribute |
| --- | --- |
| Record Type | Indicates a Type of Record (e.g., Structure Type) |
| ID | Bridge Identification Information |
| L | Deck Length |
| W | Deck Width |
| C | Under Clearance (e.g., Substructure Height) |
| OV_C | Over Clearance |
| D_C | Deck Condition |
| C_C | Culvert/Bridge Condition |
| SP_C | Superstructure Condition |
| SB_C | Substructure Condition |
| SPAN | Number of Spans |
| TYPE | Structure Type |
| TITLE | Structure Number |
| SO | Service On the Bridge |
| SU | Service Under the Bridge |

Additionally, viewing parameters can be assigned to create a view of the 3D model once the 3D model is generated. For example, parameters such as viewing angle, limits of coordinate parameters (e.g., x, y, and z parameters for the Cartesian coordinates), and a title can be assigned. The viewing angle can be established using two measurements, θ (e.g., an angle with respect to the z axis) and φ (e.g., an angle with respect to the x axis).

In some aspects, the 3D models can be generated from the retrieved data using basic shapes, such as cubes, planes, and polygons. FIG. 1 shows an example of a 3D model generated by retrieved data. In some aspects, the structures which comprise the database can be bridges. Each of the structures can be composed of one or more structural components. For example, each bridge can comprise three structural components: a deck, a superstructure, and a substructure. Each bridge can further comprise a left and/or right abutment. Generating the 3D models can be an accumulative process, with each structural component being generated separately as one or more shapes. In an aspect, each shape can be generated independently and positioned in a coordinate system (e.g., a Cartesian coordinate system) to create a complete model of the structure.

Figure 2:
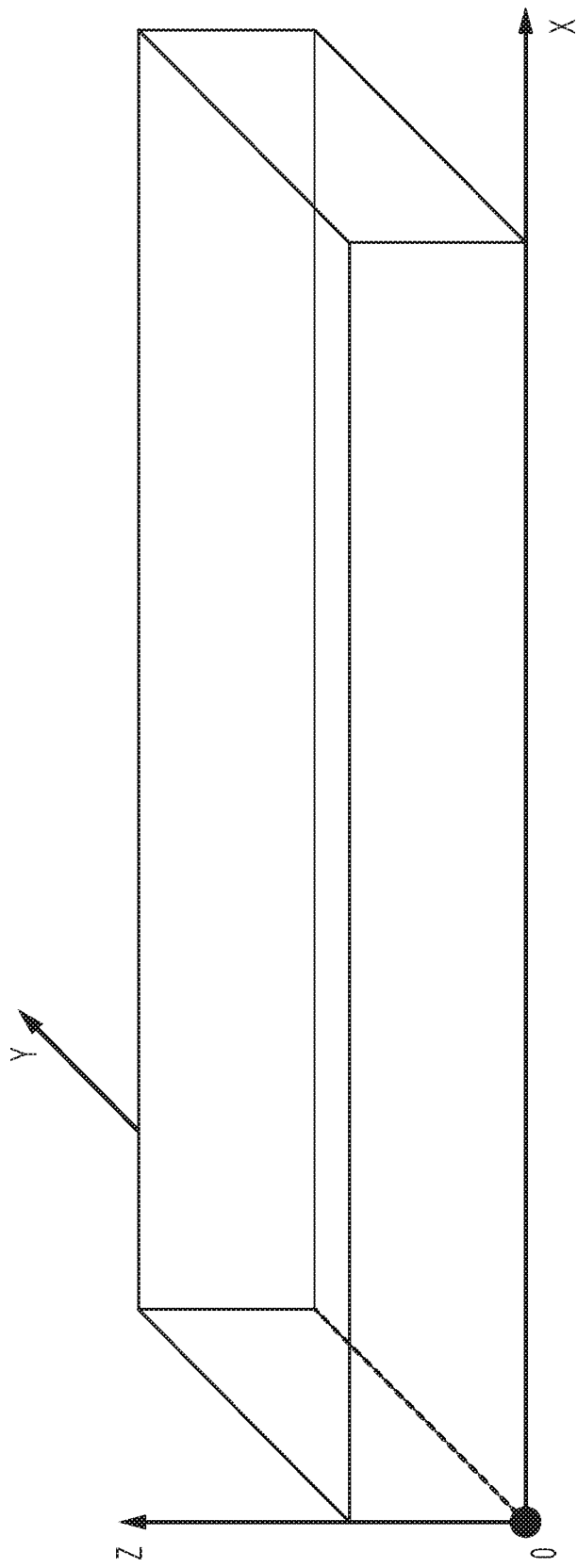
FIG. 2 is an illustration of a structural component of a three dimensional model of an infrastructure element and its location on the Cartesian coordinates system for the model produced using the methods described herein.

As shown in FIG. 2, a first structural component can be generated. In some aspects, the first structural component can be generated based on one or more vectors from the database, one or more default values, or combinations thereof. For example, default values can be used to generate the first structural component when a vector value is missing or when no vector in the retrieved data indicates a particular measurement of the structure. In an aspect, default values for the 3D model can be selected based on average (e.g., mean) values for a particular measurement across multiple structures of a particular type, one or more other vector values, aesthetic choices, or combinations thereof. As an example, in the case of a bridge, the deck can be generated. The deck length (e.g., the vector L) and the deck width (e.g., the vector W) can be used to generate a plane matching the width and length of the structure. Since deck height is not measured (and thus not included in the retrieved data), a default value is used to define a deck height. In some aspects the deck height can be set to a preselected value (e.g., 0.5 meters). For example, the deck height can be selected based on average deck height for bridges. In other aspects, the deck height can be selected based on one or more of the deck width and the deck length. For example, a deck with a larger surface area (e.g. greater length and/or width) can have a greater deck height assigned. In an aspect, the deck can be positioned within the Cartesian coordinate system. For example, one corner of the deck can be positioned at the origin.

Figure 3:
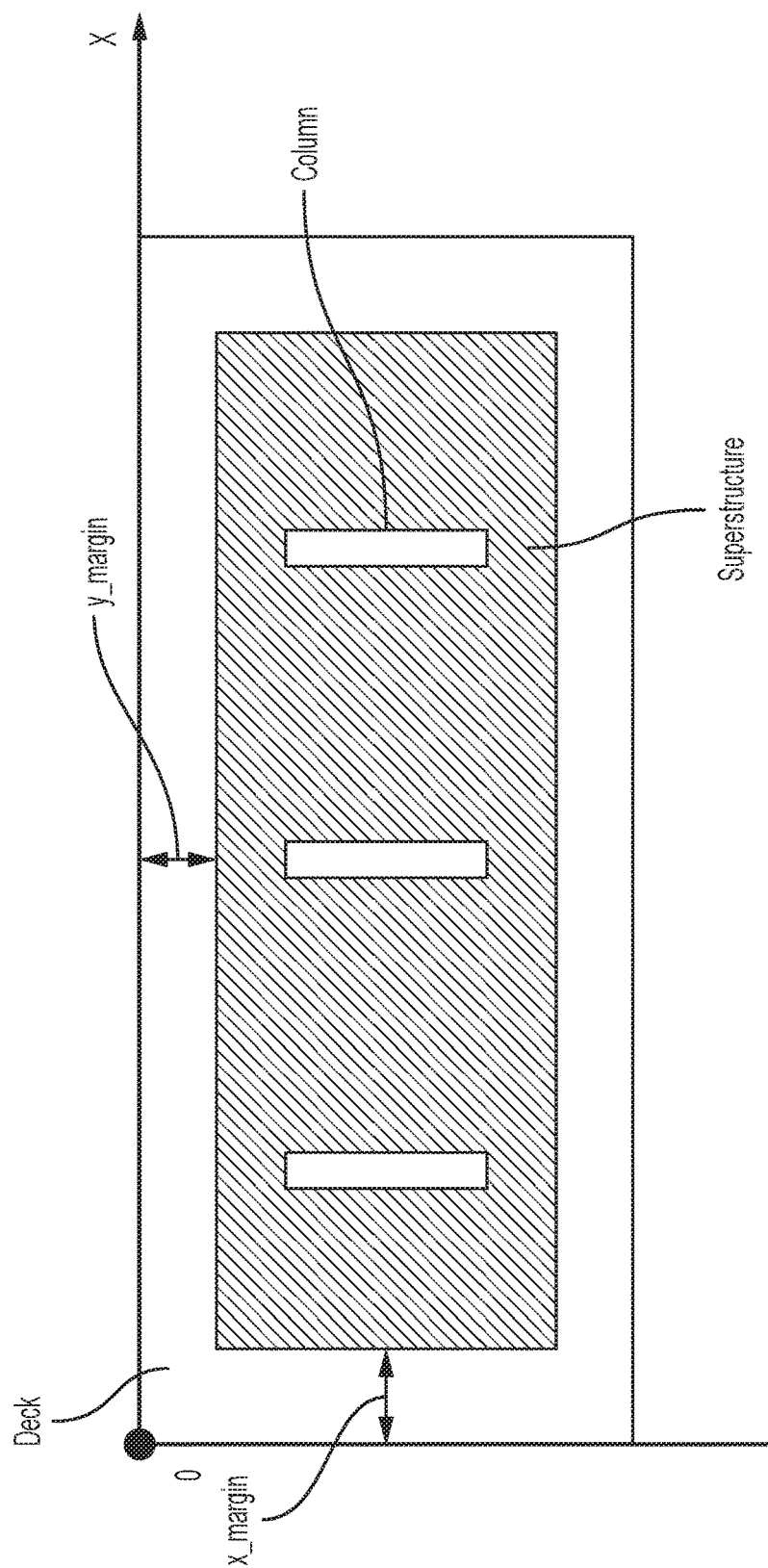
FIG. 3 is an illustration of plural structural components rendered together according to methods described herein.

A second structural component can be generated once generation of the first substructure is complete. For example, in the case of a bridge, the superstructure can be generated. In some aspects, geometric information regarding the superstructure can be omitted from the retrieved data. That is, the superstructure length, width, and height are not present in the retrieved data. The superstructure length and width can be estimated such that the superstructure length does not exceed the deck length L and the superstructure width does not exceed the deck width W. In an aspect, a width margin (e.g., an x_margin) and a length margin (e.g., a y_margin) can be determined as shown in FIG. 3. In some aspects, the width margin can be selected as a portion (e.g., a fraction or a percentage) of the deck width (e.g., the width margin can be set to W/9), and the length margin can be selected as a portion (e.g., a fraction or a percentage) of the deck length (e.g., the length margin can be set to L/12). In other aspects, the width margin and the length margin can be absolute values. In some aspects the superstructure height can be set to a preselected absolute value (e.g., 0.7 meters). In other aspects, the superstructure height can be selected based on one or more of the deck width and the deck length. For example, a bridge comprising a deck having a larger surface area (e.g. greater length and/or width) can have a greater superstructure height assigned as compared to a bridge comprising a deck having a smaller surface area. In an aspect, the superstructure can be positioned within the Cartesian coordinate system, adjacent to the deck. For example, the superstructure can abut the deck in the z direction, and can be centered with respect to the deck in the x and y directions, as shown in FIG. 3.

In some aspects, a third structural component can be generated as part of the 3D model. For example, in the case of a bridge, the substructure can be generated based on the retrieved data. In an aspect, the substructure can comprise a number of columns. In some aspects, the number of columns that comprise the substructure can be omitted from direct representation in the retrieved data. However, the number of columns can be calculated based on the SPAN vector, which comprises the number of spans present in the bridge. In an aspect, each column can have a height, a width, and a thickness. In an aspect, the column height can be based on the under clearance (C) from the retrieved information. In some aspects, the column width and column thickness can be set to default values. For example, both the column width and the column thickness can be set to predefined values. In an aspect, the column width can be selected based on a deck width. In an aspect, column thickness can be selected based on a deck length. In an aspect, the substructure can be positioned within the Cartesian coordinate system, adjacent to the superstructure. For example, the substructure can abut the superstructure in the z direction, and can be centered with respect to the deck and the superstructure in the x and y directions. FIG. 3 shows the columns of the substructure abutting the superstructure.

Figure 4:
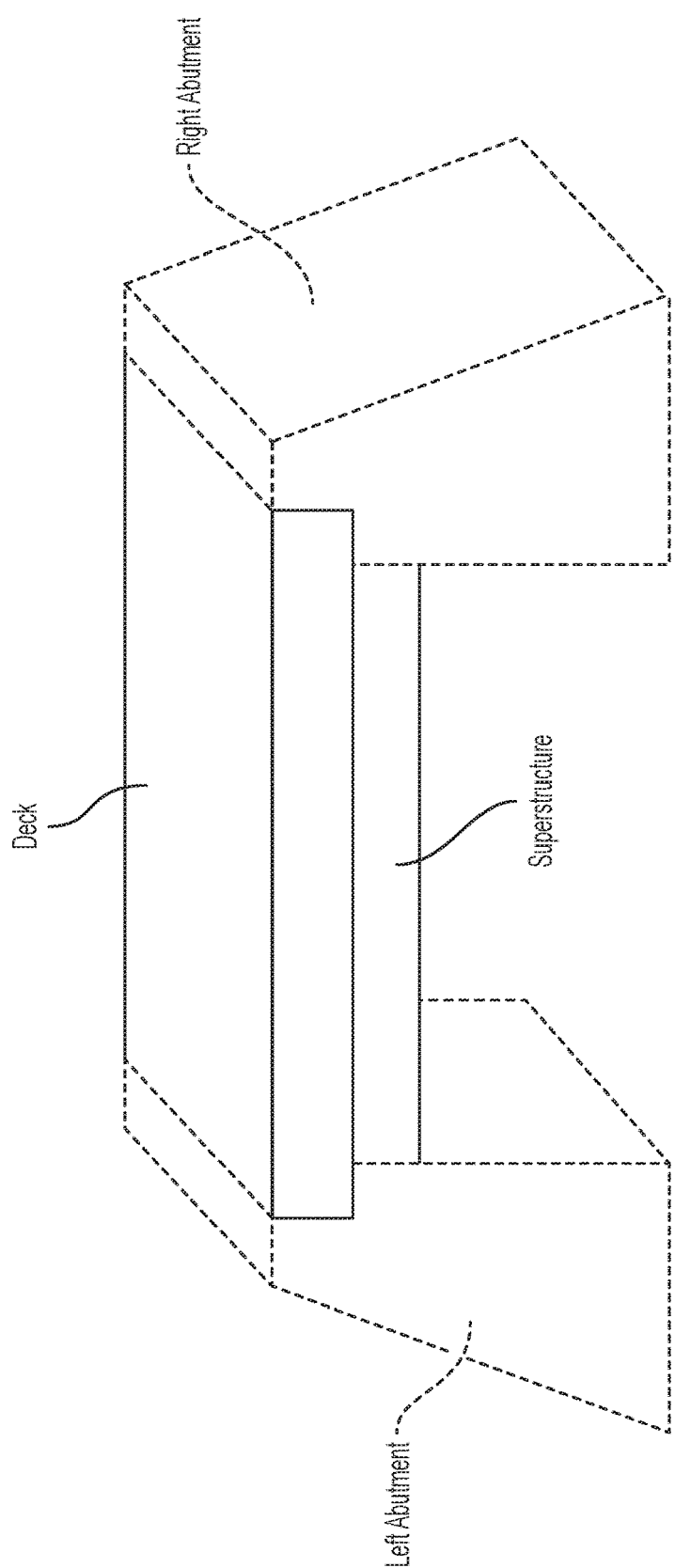
FIG. 4 is an illustration showing additional default structural components created according to methods described herein.

In some aspects, additional features surrounding a structure can be generated as part of the 3D model. For example, as shown in FIG. 4, abutments can be positioned adjacent to (e.g., abutting) a bridge and can be modeled as a part of the bridge. Vectors used to model an abutment can comprise an abutment height, a total abutment thickness, a superstructure support thickness, and a deck level thickness. In an aspect, the abutment height can be equal to a total of the under clearance (C), the superstructure height, and the deck height. The total abutment thickness can be measured at a lowest point in the vertical (z axis) direction, measured along the bridge length (x axis) direction. The abutment can comprise a superstructure support extending beneath the superstructure. The superstructure support thickness can be a measure of the thickness of the superstructure support, measured along the bridge length (x axis) direction. The deck level thickness can be a measure of the thickness of the abutment at a highest vertical (z axis) position, measured along the bridge length (x axis) direction. In some aspects, an abutment width can also be specified. In other aspects, and abutment width can correspond to the deck width.

As shown in FIG. 5, in an aspect, the condition information (e.g., the vectors D_C, C_C, SP_C, and/or SB_C) can be used to provide a visual cue that indicates the condition of one or more of the substructures. For example, each substructure can be assigned a color based on the condition data. In some aspects, the condition information can comprise one or more measurements from inspection data. The condition information can be a numeric representation of qualitative and/or quantitative condition measurements.

In an aspect, one or more text labels can be placed on the 3D model. For example, the text labels can comprise deck length, a deck width, an under clearance, an over clearance, and the like. In an aspect, the text labels can provide information directly from the retrieved data.

Figure 7:
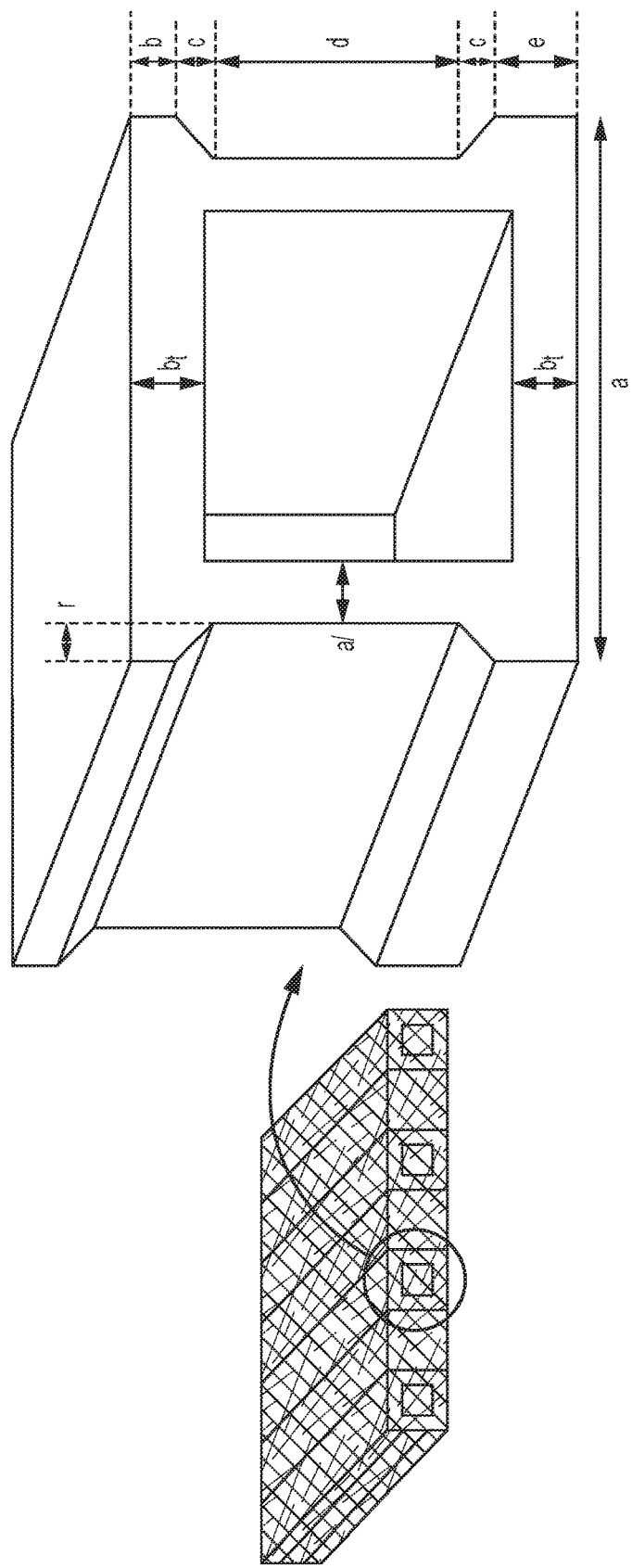
FIG. 7 is an illustration showing enhanced details of a girder used in the particular bridge type shown in FIG. 6A.

In some aspects, additional structure types can be generated. For example, as shown in FIG. 6A, some bridge types can be modeled using multiple or spread girders using default values. In some aspects the default values can be determined based on one or more of a superstructure height and a superstructure width as shown in FIG. 7. In some aspects, each girder (box beam) can be individually modeled. In other aspects, a single example girder can be modeled and repeated. As another example in FIG. 6B, a culvert structure can be modeled using default values, either separately or as a part of a bridge. Additional structure types (e.g., additional bridge types) can also be modeled.

Figure 8:
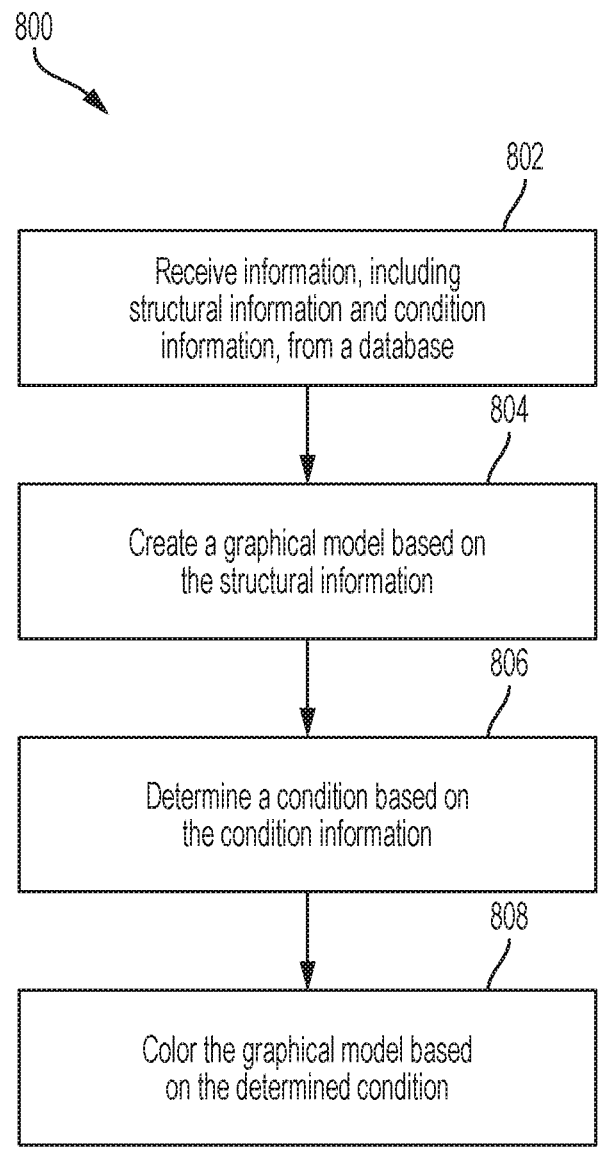
FIG. 8 is a flowchart illustrating an example method.

FIG. 8 is a flowchart illustrating an example method 800. In step 802, a computer can receive information from a database. The information can comprise at least structural information describing a form (e.g., geometric features) of a structure and condition information describing a condition of the structure. For example, the structure can be a structure critical to state infrastructure, such as a bridge, a culvert, a communications tower, guardrails, and the like. In an aspect, the condition information can comprise quantitative measurements indicating condition of the structure. In other aspects, the condition information can comprise one or more qualitative indications of the condition of the structure.

In step 804, the computer can create a graphical model of the structure based on the structural information. In an aspect, the graphical model can be a 3D representation of the structure. In some aspects, the structure can be divided into one or more structural components. For example, a bridge can be divided into a deck, a superstructure, and a substructure. The one or more structural components can also comprise adjacent pieces of infrastructure, such as bridge abutments.

In some aspects, creating the graphical model of the structure can comprise separately modeling one or more (e.g., each) of the structural components based on the structural information. For example, the one or more structural components can be modeled using primitive shapes, such as cubes, planes, and other polygons. In some aspects, creating the graphical model can comprise using received structural information to model each of the structural components. In an aspect, the structural information can be incomplete (e.g., missing one or more piece of information regarding the composition or geometric features of the structure). In response to a determination that the structural information is incomplete, respective default values can be used in place of the received structural information for at least the one or more missing items of information. In some aspects, the default values can be predefined values that are the same for any structure (e.g., the default value for a deck height of a bridge can be set to 0.5 meters). In other aspects, the default values can be selected based on one or more items of information present in the structural information (e.g., the superstructure length can be set as a fraction of the deck length). In some aspects, default values can be set for each item of structural information, and the retrieved information can overwrite the default values.

In some aspects, the one or more structural components can be positioned adjacent to one another in a coordinate system (e.g., a Cartesian coordinate system) for display to a user of the computer.

In step 806, the computer can determine, based on the condition information, a condition of one or more of the structural components. For example, in the case of a bridge, the condition information can provide information as to the condition of the deck, the superstructure, and the substructure. The condition information can also comprise information regarding condition of bridge abutments, culverts, and the like. In some aspects, the condition information can indicate physical properties of the structural components (e.g., a portion of the component that has rusted or otherwise degraded). In other aspects, the condition information can comprise qualitative indications of the structure condition. In some aspects, American Association of State Highway and Transportation Officials (AASHTO) Guide for Commonly Recognized Structural elements can be used as a basis for the condition information. In some aspects, the condition information can comprise, for each structural component, a numerical rating between 0 and 9, where 0 indicates a failed condition, and 9 indicates excellent condition.

In step 808, the computer can color the one or more structural components of the structure based on the determined condition. For example, multiple colors (e.g., 10 colors) can be used to indicate the condition of the structural components. In some aspects, the colors can be selected from a color gradient from green (e.g., to indicate good condition) to red (e.g., to indicate poor condition). As a particular example, the below chart shows a bridge condition rating indicating the condition of a bridge and corresponding RGB color values that can be used to indicate the condition:

| Bridge Condition Rating | RGB Color Value |
| --- | --- |
| 9 - Excellent condition | #2DB600 |
| 8 - Very good condition | #13DE00 |
| 7 - Good condition | #1CFF00 |
| 6 - Satisfactory condition | #AAFF00 |
| 5 - Fair condition | #FFEB00 |
| 4 - Poor condition | #FFB900 |
| 3 - Serious condition | #FF6D00 |
| 2 - Critical condition | #FF1200 |
| 1 - "Imminent" failure condition | #CB0000 |
| 0 - Failed condition | #8B0000 |

In some aspects, the colors can be selected so that a user's attention can be drawn to structural components that are in need of repair. For example, components that are failing can be colored red, while components in excellent condition can be colored green.

In some aspects, the computer can provide an output based on the created graphical model and/or the determined condition of the structural components. The output can comprise, for example, the created graphical model and/or a report describing the bridges and/or the determined condition of the structural components thereof. In some aspects, the computer can output an alert if a condition of one or more of the structural components falls below a predefined threshold. For example, the alert can comprise a graphical, and/or textual message, an audible alert, and/or the like. The alert can comprise an electronic message, such as an email, an SMS message, or the like. The alert can comprise an audible message, such as an automated telephone call. The alert can comprise information relating to the condition of one or more of the one or more structural components of the bridge.

In some aspects, creation of the graphical model and/or output of the graphical model can trigger inspection and/or repair of the one or more structural components. As an example, a worker (e.g., a civil engineer, repair worker, etc.) can be tasked with inspection of a bridge based on the created graphical model. In particular, the created graphical model can provide guidance related to particular features of the structure to be inspected (e.g., structural components having a condition below a predefined threshold). In some aspects, a work order can be created based on the created graphical model and/or the generated alert. In some aspects, one or more workers can be dispatched to a bridge based on the created graphical model and/or the generated alert. The dispatched workers can travel to the determined structure and perform inspection and/or repair work as needed.

Figure 9:
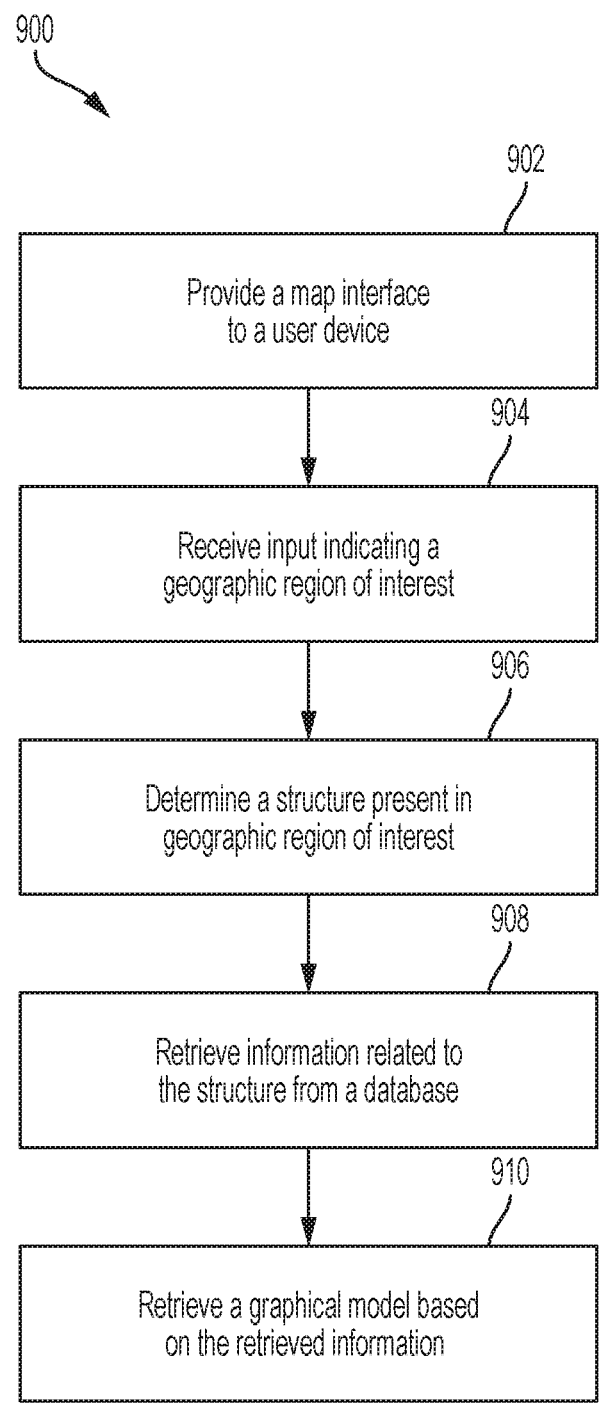
FIG. 9 is a flowchart illustrating another example method.

FIG. 9 is a flowchart illustrating an example method 900. In step 902, a user device can be provided with a map interface. In some aspects, the user device can comprise a computer and can generate the map interface locally. In other aspects, the user device can be provided with the map interface by a server computer. The map interface can comprise a map showing one or more structures regarded as infrastructure elements. For example, the map interface can comprise a plurality of bridges and/or culverts disposed within a state or other geographic region.

In step 904, the user device can receive input indicating a geographic region of interest. For example a user can use a pointing device such as a mouse to identify the geographic region of interest. In particular, the region of interest can comprise a single structure, or an area including one or more structures.

In step 906, the user device can determine a structure present in the geographic region of interest. In some aspects, determining a structure can comprise determining the structure nearest to a point indicated by a user. In other aspects, determining the structure can comprise identifying one or more structures within an area identified by the user in step 904.

In step 908, the user device can retrieve information from a database. The retrieved information can comprise information describing the structure determined in step 906. In some aspects, the structure can be divided into one or more structural components. For example, a bridge can be divided into a deck, a superstructure, and a substructure. The one or more structural components can also comprise adjacent pieces of infrastructure, such as bridge abutments. In some aspects, the retrieved information can comprises at least structural information describing a form (e.g., key geometric features) of each of the structural components.

In some aspects, the retrieved information can further comprise condition information. In an aspect, the condition information can comprise quantitative measurements indicating condition of one or more structural components of the structure. In other aspects, the condition information can comprise one or more qualitative indications of the condition of the one or more structural components of the structure. For example, in the case of a bridge, the condition information can provide information as to the condition of the structural components (e.g., a deck, a superstructure, and a substructure). The condition information can also comprise information regarding condition of bridge abutments, culverts, and the like. In some aspects, the condition information can indicate physical properties of the structural components (e.g., a portion of the component that has rusted or otherwise degraded). In other aspects, the condition information can comprise qualitative indications of the structure condition. In some aspects, AASHTO Guide for Commonly Recognized Structural elements can be used as a basis for the condition information. In some aspects, the condition information can comprise, for each structural component, a numerical rating between 0 and 9, where 0 indicates a failed condition, and 9 indicates excellent condition.

In step 910, the user device can retrieve a graphical model of the structure based on the structural information. In an aspect, the graphical model can be a 3D representation of the structure. In some aspects, the structure can be divided into one or more structural components. For example, a bridge can be divided into a deck, a superstructure, and a substructure. The one or more structural components can also comprise adjacent pieces of infrastructure, such as bridge abutments. In some aspects, the retrieved graphical model can be created in response to new information being added to the database. In other aspects, the retrieved graphical model can be created in response to the user input in step 904.

In some aspects, the graphical model of the structure can comprise one or more separately modeled structural components based on the structural information. For example, the one or more structural components can be modeled using primitive shapes, such as cubes, planes, and other polygons. In some aspects, creating the graphical model can comprise using received structural information to model each of the structural components. In an aspect, the structural information can be incomplete (e.g., missing one or more piece of information regarding the composition or geometric features of the structure). In response to a determination that the structural information is incomplete, respective default values can be used in place of the received structural information for at least the one or more missing items of information. In some aspects, the default values can be predefined values that are the same for any structure (e.g., the default value for a deck height of a bridge can be set to 0.5 meters). In other aspects, the default values can be selected based on one or more items of information present in the structural information (e.g., the superstructure length can be set to 95% of the deck length).

In some aspects, the user device can determine a condition of each of the one or more structural components. For example, the user device can determine if each of the components is in good condition, acceptable condition, or failing condition. In some aspects, the condition of each of the structural components can be determined according to established guidelines, such as guidelines established in the NBI manual. In an aspect, the user device can color the one or more structural components of the structure based on the determined condition. In some aspects, the colors can be selected so that a user's attention can be drawn to structural components that are in need of repair. For example, components that are failing can be colored red, while components in excellent condition can be colored green.

In some aspects, the structural information can be incomplete (e.g., missing one or more piece of information regarding the composition or geometric features of the structure). In response to a determination that the structural information is incomplete, respective default values can be used in place of the received structural information for at least the one or more missing items of information. In some aspects, the default values can be predefined values that are the same for any structure (e.g., the default value for a deck height of a bridge can be set to 0.5 meters). In other aspects, the default values can be selected based on one or more items of information present in the structural information (e.g., the superstructure length can be set to 95% of the deck length).

Figure 10:
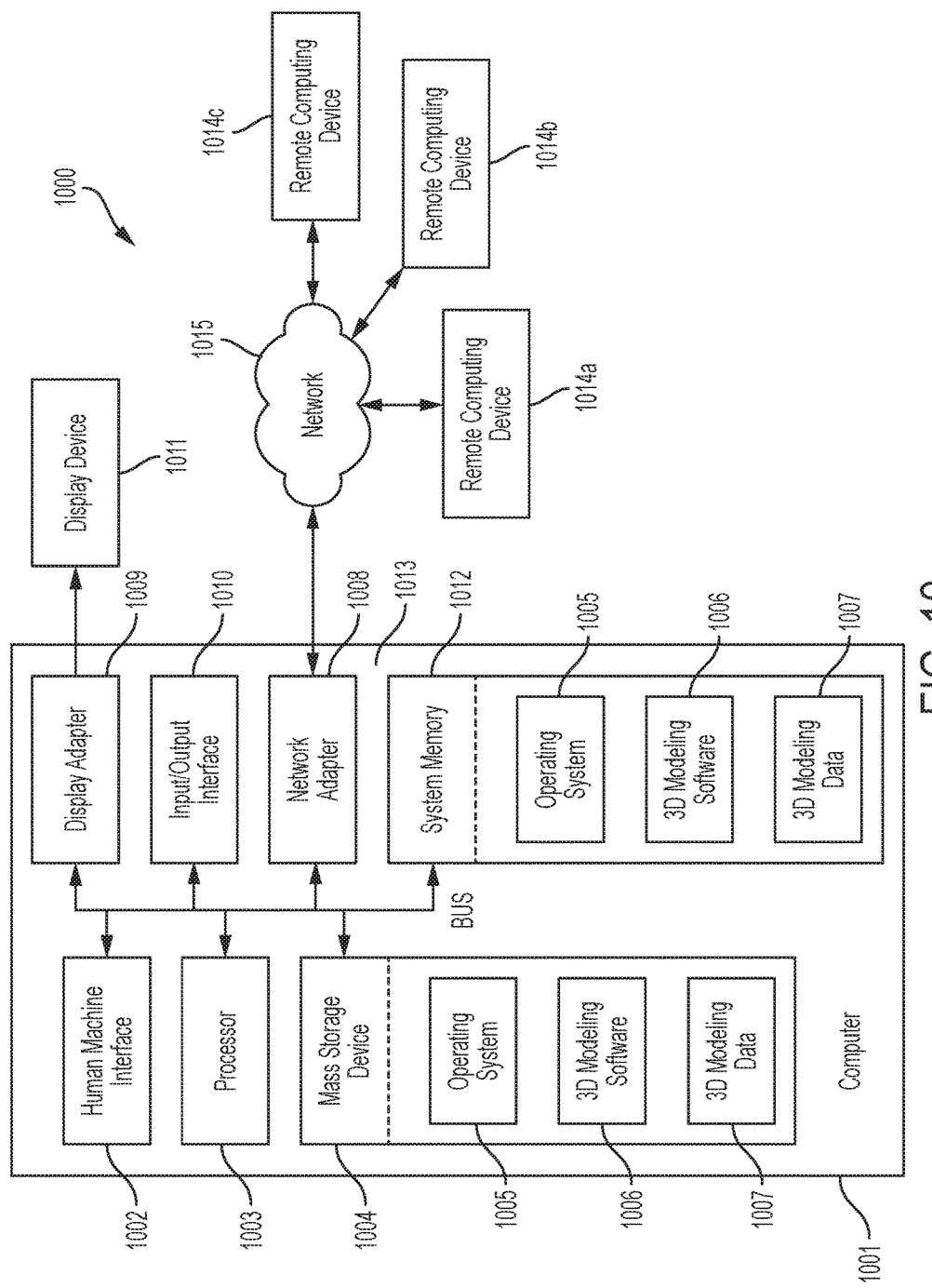
FIG. 10 is a block diagram illustrating an example computing device.

In an exemplary aspect, the methods and systems can be implemented on a computer 1001 as illustrated in FIG. 10 and described below. The methods and systems disclosed can utilize one or more computers to perform one or more functions in one or more locations. FIG. 10 is a block diagram illustrating an exemplary operating environment for performing the disclosed methods. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well-known computing systems, environments, and/or configurations that can be suitable for use with the systems and methods comprise, but are not limited to, personal computers, server computers, laptop devices, and multiprocessor systems. Additional examples comprise set top boxes, programmable consumer electronics, network PCs, minicomputers, mainframe computers, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

Further, one skilled in the art will appreciate that the systems and methods disclosed herein can be implemented via a general-purpose computing device in the form of a computer 1001. The components of the computer 1001 can comprise, but are not limited to, one or more processors 1003, a system memory 1012, and a system bus 1013 that couples various system components including the one or more processors 1003 to the system memory 1012. The system can utilize parallel computing.

The system bus 1013 represents one or more of several possible types of bus structures, including a memory bus or memory controller, a peripheral bus, an accelerated graphics port, or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCM-CIA), Universal Serial Bus (USB) and the like. The bus 1013, and all buses specified in this description can also be implemented over a wired or wireless network connection and each of the subsystems, including the one or more processors 1003, a mass storage device 1004, an operating system 1005, three dimensional modeling software 1006, three dimensional modeling data 1007, a network adapter 1008, the system memory 1012, an Input/Output Interface 1010, a display adapter 1009, a display device 1011, and a human machine interface 1002, can be contained within one or more remote computing devices 1014a,b,c at physically separate locations, connected through buses of this form, in effect implementing a fully distributed system.

The computer 1001 typically comprises a variety of computer readable media. Exemplary readable media can be any available media that is accessible by the computer 1001 and comprises, for example and not meant to be limiting, both volatile and non-volatile media, removable and non-removable media. The system memory 1012 comprises computer readable media in the form of volatile memory, such as random access memory (RAM), and/or non-volatile memory, such as read only memory (ROM). The system memory 1012 typically contains data such as the three dimensional modeling data 1007 and/or program modules such as the operating system 1005 and the three dimensional modeling software 1006 that are immediately accessible to and/or are presently operated on by the one or more processors 1003.

In another aspect, the computer 1001 can also comprise other removable/non-removable, volatile/non-volatile computer storage media. By way of example, FIG. 10 illustrates the mass storage device 1004 which can provide non-volatile storage of computer code, computer readable instructions, data structures, program modules, and other data for the computer 1001. For example and not meant to be limiting, the mass storage device 1004 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 1004, including by way of example, the operating system 1005 and the three dimensional modeling software 1006. Each of the operating system 1005 and the three dimensional modeling software 1006 (or some combination thereof) can comprise elements of the programming and the three dimensional modeling software 1006. The three dimensional modeling data 1007 can also be stored on the mass storage device 1004. The three dimensional modeling data 1007 can be stored in any of one or more databases known in the art. Examples of such databases comprise, DB2®, Microsoft® Access, Microsoft® SQL Server, Oracle®, mySQL, PostgreSQL, and the like. The databases can be centralized or distributed across multiple systems.

In another aspect, the user can enter commands and information into the computer 1001 via an input device (not shown). Examples of such input devices comprise, but are not limited to, a keyboard, pointing device (e.g., a "mouse"), a microphone, a joystick, a scanner, tactile input devices such as gloves, and other body coverings, and the like These and other input devices can be connected to the one or more processors 1003 via the human machine interface 1002 that is coupled to the system bus 1013, but can be connected by other interface and bus structures, such as a parallel port, game port, an IEEE 1394 Port (also known as a Firewire port), a serial port, or a universal serial bus (USB).

In yet another aspect, the display device 1011 can also be connected to the system bus 1013 via an interface, such as the display adapter 1009. It is contemplated that the computer 1001 can have more than one display adapter 1009 and the computer 1001 can have more than one display device 1011. For example, the display device 1011 can be a monitor, an LCD (Liquid Crystal Display), or a projector. In addition to the display device 1011, other output peripheral devices can comprise components such as speakers (not shown) and a printer (not shown) which can be connected to the computer 1001 via the Input/Output Interface 1010. Any step and/or result of the methods can be output in any form to an output device. Such output can be any form of visual representation, including, but not limited to, textual, graphical, animation, audio, tactile, and the like. The display device 1011 and computer 1001 can be part of one device, or separate devices.

The computer 1001 can operate in a networked environment using logical connections to one or more remote computing devices 1014a,b,c. By way of example, a remote computing device can be a personal computer, portable computer, smartphone, a server, a router, a network computer, a peer device or other common network node, and so on. Logical connections between the computer 1001 and a remote computing device 1014a,b,c can be made via a network 1015, such as a local area network (LAN) and/or a general wide area network (WAN). Such network connections can be through the network adapter 1008. The network adapter 1008 can be implemented in both wired and wireless environments. Such networking environments are conventional and commonplace in dwellings, offices, enterprise-wide computer networks, intranets, and the Internet.

For purposes of illustration, application programs and other executable program components such as the operating system 1005 are illustrated herein as discrete blocks, although it is recognized that such programs and components reside at various times in different storage components of the computing device 1001, and are executed by the one or more processors 1003 of the computer. An implementation of the three dimensional modeling software 1006 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

The methods and systems can employ Artificial Intelligence techniques such as machine learning and iterative learning. Examples of such techniques include, but are not limited to, expert systems, case based reasoning, Bayesian networks, behavior based AI, neural networks, fuzzy systems, evolutionary computation (e.g. genetic algorithms), swarm intelligence (e.g. ant algorithms), and hybrid intelligent systems (e.g. Expert inference rules generated through a neural network or production rules from statistical learning).

While the methods and systems have been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

It will be apparent to those skilled in the art that various modifications and variations can be made without departing from the scope or spirit. Other embodiments will be apparent to those skilled in the art from consideration of the specification and practice disclosed herein. It is intended that the specification and examples be considered as exemplary only, with a true scope and spirit being indicated by the following claims.

What is claimed is:

1. A method comprising:
    receiving, from a database, a plurality of vectors indicative of a form of a structure and a condition of one or more portions of the structure, wherein each vector of the plurality of vectors is associated with a given portion of the one or more portions of the structure and comprises a numerical rating indicative of the condition of the given portion;
    generating, based on the plurality of vectors, a graphical model of the structure;
    determining, based on the numerical rating of the given portion of the one or more portions of the structure, a condition of the given portion;
    modifying, based on the numerical rating of the given portion and the determined condition, a color associated with the given portion depicted by the graphical model; and
    generating, based on the numerical rating associated with the given portion exceeding a condition threshold, an alert message.

2. The method of claim 1, wherein the structure is one of a bridge or a culvert.

3. The method of claim 2, wherein the one or more portions of the structure comprise at least a deck, a superstructure, and a substructure.

4. The method of claim 1, wherein generating the graphical model comprises separately modeling the one or more portions of the structure based on the plurality of vectors.

5. The method of claim 1, wherein generating the graphical model comprises using default values in response to one or more items being missing from the plurality of vectors.

6. The method of claim 5, wherein the default values are predefined.

7. The method of claim 5, wherein the default values are based on the plurality of vectors.

8. A method comprising:
    providing a map interface to a user device;
    receiving input indicating a geographic region of interest;
    determining a structure present in the geographic region of interest;
    retrieving, for the structure in the geographic region of interest from a database, a plurality of vectors indicative of a form of the structure, wherein each vector of the plurality of vectors is associated with a given portion of one or more portions of the structure and comprises a numerical rating indicative of a condition of the given portion;

generating, based on the plurality of vectors, a graphical model of the structure; and generating, based on the numerical rating associated with the given portion of one or more portions of the structure exceeding a condition threshold, an alert message, wherein the given portion is associated with the geographic region of interest.

9. The method of claim 8, wherein the retrieved plurality of vectors further comprises condition information indicating a structural integrity of the one or more portions of the structure.

10. The method of claim 9, further comprising:

determining, based on the numerical rating associated with the given portion of the one or more portions of the structure, the condition of the given portion of the structure associated with the geographic region of interest; and modifying, based on the numerical rating of the given portion and the determined condition, a color associated with the given portion depicted by the graphical model.

11. The method of claim 8, wherein the structure is one of a bridge or a culvert.

12. The method of claim 8, wherein generating the graphical model comprises separately modeling one or more portions of the structure based on the plurality of vectors.

13. The method of claim 8, wherein generating the graphical model comprises using default values in response to one or more items being missing from the plurality of vectors.

14. The method of claim 13, wherein the default values are predefined.

15. The method of claim 13, wherein the default values are based on the plurality of vectors.

16. A system comprising:

a memory comprising computer-executable instructions; and a processor functionally coupled to the memory and configured, by the computer-executable instructions, to:

receive, from a database, a plurality of vectors indicative of a form of one or more portions of a structure, wherein each vector of the plurality of vectors is associated with a given portion of the one or more portions of the structure and comprises a numerical rating indicative of a condition of the given portion;

generate, based on the plurality of vectors, a graphical model of the structure;

determine, based on the numerical rating of the given portion of the one or more portions of the structure, a condition of the given portion;

modify, based on the numerical rating of the given portion and the determined condition, a color associated with the given portion depicted by the graphical model; and generate, based on the numerical rating associated with the given portion exceeding a condition threshold, an alert message.

17. The system of claim 16, wherein generating the graphical model comprises using default values in response to one or more items being missing from the plurality of vectors.

18. The system of claim 17, wherein the default values are predefined.

19. The system of claim 17, wherein the default values are based on the plurality of vectors.

20. The system of claim 16, wherein generating the graphical model comprises separately modeling the one or more portions of the structure based on the plurality of vectors.

* * * * *